United States Patent [19]

Aoki et al.

[11] 4,169,269
[45] Sep. 25, 1979

[54] JUNCTION FIELD EFFECT TRANSISTOR

[75] Inventors: Kiyoshi Aoki; Hisao Kamo, both of Yokohama, Japan

[73] Assignee: Tokyo Shibaura Electric Co., Ltd., Japan

[21] Appl. No.: 856,540

[22] Filed: Dec. 1, 1977

[30] Foreign Application Priority Data

Dec. 2, 1976 [JP] Japan .................... 51-144013

[51] Int. Cl.² .................... H01L 298/80
[52] U.S. Cl. .................... 357/22; 357/89; 357/90
[58] Field of Search .................... 357/22, 89, 90

[56] References Cited

U.S. PATENT DOCUMENTS 4,041,517 8/1977 Fuse et al. .................... 357/22

OTHER PUBLICATIONS

Ozawa, Osamu, *Supplement of Jap. Jour. of Applied Physics*, vol. 15, 1976, pp. 171-177.

*Primary Examiner*—Edward J. Wojciechowicz
*Attorney, Agent, or Firm*—Finnegan, Henderson, Farabow & Garrett

[57] ABSTRACT

A junction field effect transistor has a first conductivity type substrate with high impurity concentration, a first conductivity type layer with low impurity concentration which is layered on the substrate, a first region of first conductivity type and with high impurity concentration which is formed in the surface region of the layer, and a second region of second conductivity type and with high impurity concentration which is formed in the surface region of the layer, substantially surrounding the side wall of the first region. The thickness of the layer is within the range from 4.0 to 6.0 $\mu$m. The minimum width of the portion surrounded by the second region and the impurity concentration of the layer fall within the area with four corners A, B, C and D where these corners correspond to the four coordinates ($\log_{10} 4 \times 10^{15}$, 2.0), ($\log_{10} 18 \times 10^{15}$, 1.2), ($\log_{10} 18 \times 10^{15}$, 0.5) and ($\log_{10} 4 \times 10^{15}$, 1.1) of a rectangular coordinates of which the Y-distance represents the minimum width and the X-distance is the impurity concentration in the logarithmic scale.

2 Claims, 13 Drawing Figures

JUNCTION FIELD EFFECT TRANSISTOR

BACKGROUND OF THE INVENTION

The invention relates to a junction field effect transistor and, more particularly, a junction vertical channel field effect transistor with channels vertically formed in the thickness of the transistor substrate.

A junction field effect transistor of the type in which channels are formed vertically in the thickness of the substrate of the transistor, is known as a junction vertical channel field effect transistor.

Reference is made to FIG. 1 illustrating a known junction vertical channel field effect transistor in cross section. An N+ type silicon substrate 11 with high impurity concentration is provided thereon with an N− type layer 12 of low impurity concentration. The substrate 11 forms a drain region. A net shaped P+ type region 13 with high impurity concentration is embedded in the N− type layer 12. An N+ type region 14 with high impurity concentration is formed in the surface region of the layer 12. The region 14 forms a source region. The N+ type substrate 11 is provided with a drain electrode 15. The N+ type region 14 is provided with a source electrode 16. A gate electrode 18 is related to the region 13 through a P+ type region 17 with high impurity concentration. An insulation layer is designated by reference numeral 19, which is made of silicon, for example.

The junction vertical channel field effect transistor with such a construction above mentioned has an output current to output voltage characteristic like that of a triode vacuum tube. That is, the amount of current flowing from the drain region 11 into the source region 14 may be controlled by changing the potential of the gate region 13. This type field effect transistor has a disadvantage that the gate resistance is high and when it is used in high frequencies, the power gain and the power output is small.

For avoiding this defect, the gate region 13 is disposed in the vicinity of the surface of the layer 12 and connected directly to the gate electrode 18, unlike the FIG. 1 case in which the gate region 13 is connected to the gate electrode 18 through the embedded contacting region 17. With such a connection, the gate resistance is small so that the power output and the power gain are large. Accordingly, it is more suitable for high frequency transistors than the FIG. 1 transistor.

In such the direct-connection type field effect transistor, the impurity concentration of the N type layer is generally less than $0.1 \times 10^{16}$ cm$^{-3}$ (the resistivity is more than 4 ohm·cm) and its output current-output voltage characteristic is as shown in FIG. 2. The characteristic curves include super-linear curves (downwardly curved) of non-saturation characteristic (the drain currents increase infinitely with increase of the drain voltage), just like triode characteristic. However, its drain efficiency is not so high and it is unsatisfactory as a high frequency transistor. Incidentally, the drain efficiency is the ratio of the power output to the product of the drain voltage and the drain current. This is a very important factor expressing the function of the high frequency power active element. In FIG. 2, $V_g$ is a gate voltage.

SUMMARY OF THE INVENTION

Accordingly, the primary object of the invention is to provide a junction field effect transistor with high drain efficiency in high frequencies and high power output and power gain.

According to the invention, there is provided a junction field effect transistor having a first conductivity type substrate with high impurity concentration, a first conductivity type layer with low impurity concentration which is layered on the substrate, a first region of first conductivity type and with high impurity concentration which is formed in the surface region of the layer, and a second region of second conductivity type and with high impurity concentration which is formed in the surface region of the layer, substantially surrounding the side wall of the first region. The thickness of the layer is within the range from 4.0 to 6.0 μm. The minimum width of the portion surrounded by the second region and the impurity concentration of the layer fall within the area with four corners A, B, C and D where these corners correspond to the four coordinates ($\log_{10} 4 \times 10^{15}$, 2.0), ($\log_{10} 18 \times 10^{15}$, 1.2), ($\log_{10} 18 \times 10^{15}$, 0.5) and ($\log_{10} 4 \times 10^{15}$, 1.1) of a rectangular coordinates of which the Y-distance represents the minimum width and the X-distance is the impurity concentration in the logarithmic scale.

Other objects and features of the invention will be apparent from the following description taken in connection with the accompanying drawings, in which:

DETAILED DESCRIPTION OF THE PREFERRED EMBODIMENTS

Figure 3:
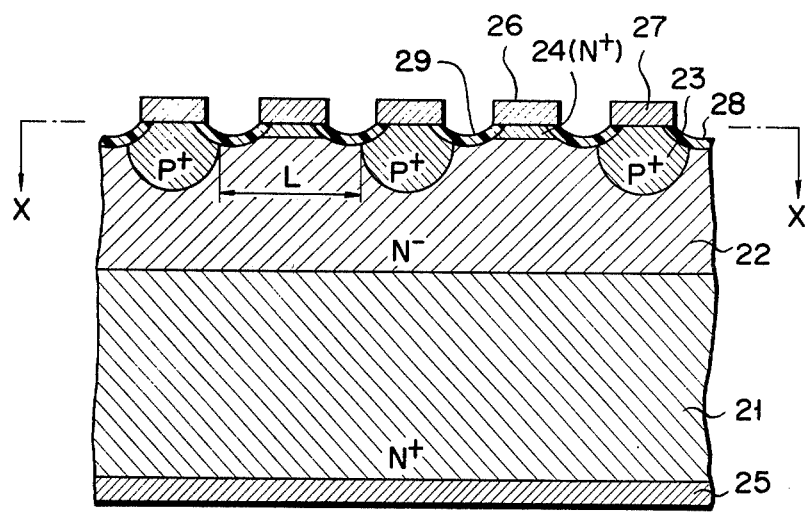
FIG. 3 is a cross sectional view of a junction field effect transistor which is an embodiment of the invention.
Figure 4:
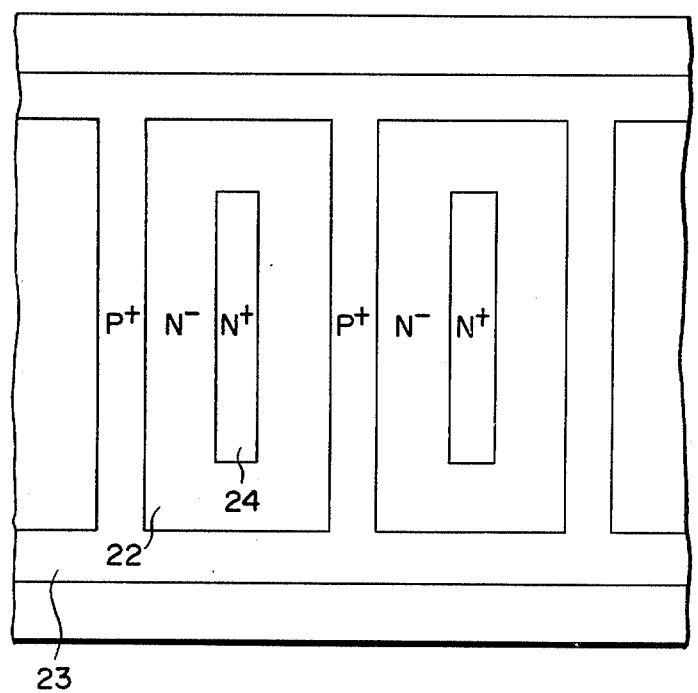
FIGS. 4 and 5 are sectional views taken along the line X—X of FIG. 3.
Figure 5:
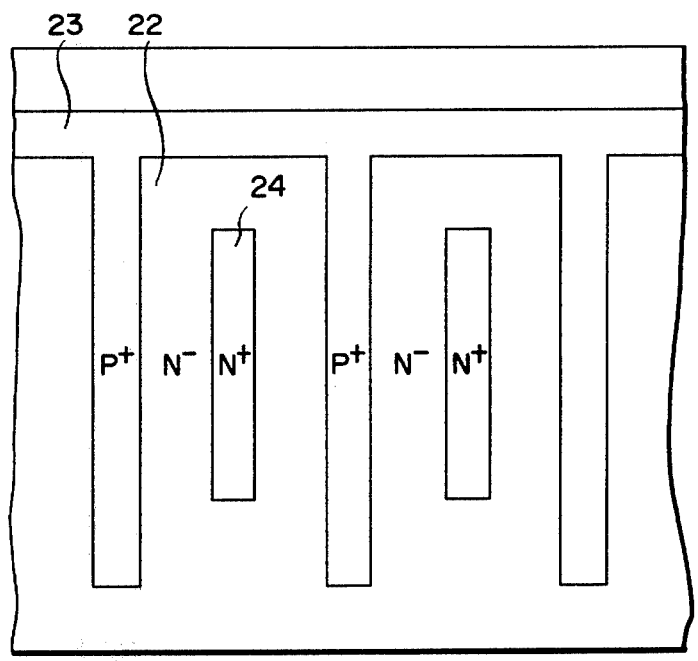

Referring now to FIG. 3, there is shown an embodiment of a junction field effect transistor (JFET) according to the present invention. As shown, an N− type layer 22 of low impurity concentration is formed on an N$^{30}$ type substrate, for example, silicon substrate 21 of high impurity concentration, by the epitaxial growth method, for example. The silicon substrate 21 constitutes a drain region. A P+ type region 23 with high impurity concentration is formed in the surface region of the N⁻ type layer by the impurity diffusion method, for example. The P⁺ type region 23 forms a gate region and has a net like configuration as viewed from the top or bottom. See FIG. 4. An N⁺ type region 24 with high impurity concentration is formed in each surface region of the layer 22 which is located in each mesh of the net like layer 23, as is also illustrated in FIG. 4. The region 24 constitutes a source region. An insulating layer 28 is layered on that surface area of the layer 22 which is located between the gate region and each source region. The insulating layer 28 is not illustrated in FIG. 4, for ease of understanding. It is to be understood that the gate region 23 is not limited in configuration to that shown in FIG. 4, but it takes any configuration if it substantially encloses the source region 24 as seen from the top or bottom view. One of the modifications of the gate region on the basis of such an idea is illustrated in FIG. 5. As shown in FIG. 5, the physical configuration of the gate region 23 imperfectly encloses the source region 24. Like reference numerals are commonly used in FIGS. 3 to 5, to designate like portions. As shown in FIG. 3, the bottom of the N⁺ type silicon substrate 21 is fixed onto a drain electrode 25 by means of gold-silicon alloy or solder. A gate electrode 27 is attached onto the gate region 23 as shown in FIG. 3, and source electrodes 26 are attached onto the corresponding source regions 24. The gate and source electrodes 27 and 26 are formed, for example, by vapor-depositing aluminum. The insulating layer 28 is made of, for example, SiO₂.

Figure 11:
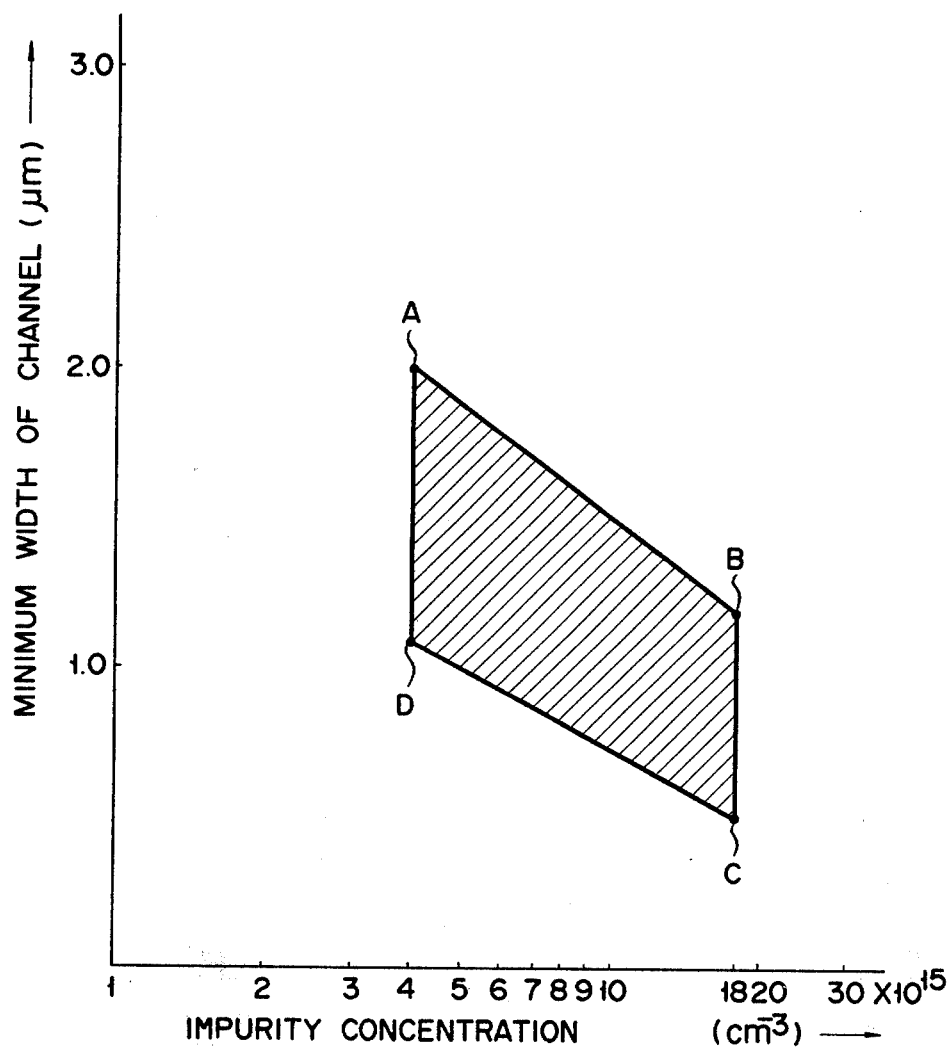
FIG. 11 shows a graph illustrating the relationship between the minimum width of the channel and the impurity concentration of the layer 22 when the transistor of FIG. 3 exhibits the characteristic shown in FIG. 8.

The construction of the field effect transistor as shown in FIG. 3 is known. The feature of the invention is that the impurity concentration of the layer 22 and the minimum channel width L, i.e. the minimum width of that portion of the N⁻ type layer 22 which is surrounded by each mesh of the net like layer 23 as shown in FIG. 3, are specifically related. More particularly, these are set up within a region defined by connecting four specific points on the rectangular coordinates of which the X-distance represents the impurity concentration in logarithmic scale and the Y-distance represents the minimum channel width L. In the graph, these four points are A ($\log_{10} 4 \times 10^{15}$, 2.0), B ($\log_{10} 18 \times 10^{15}$, 1.2), C ($\log_{10} 18 \times 10^{15}$, 0.5) and D ($\log_{10} 4 \times 10^{15}$, 1.1). This is illustrated in FIG. 11.

The explanation to follow is how such a relation between them is selected.

Figure 2:
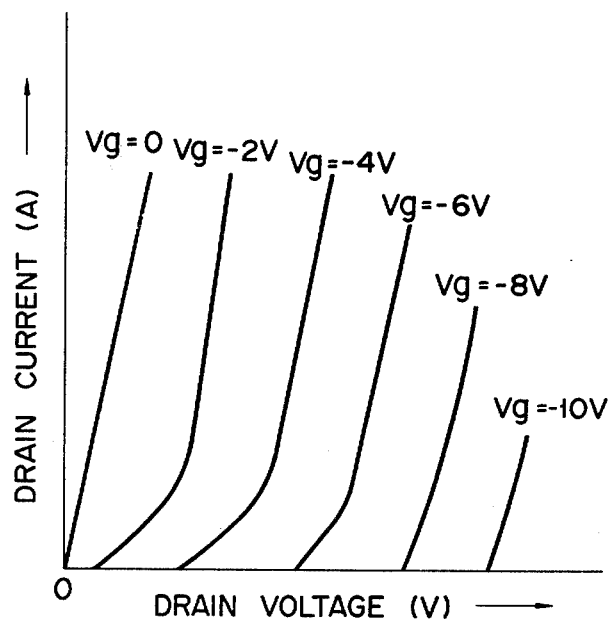
FIG. 2 shows the relationship between the drain voltage and the drain current of the field effect transistor of FIG. 1.
Figure 6:
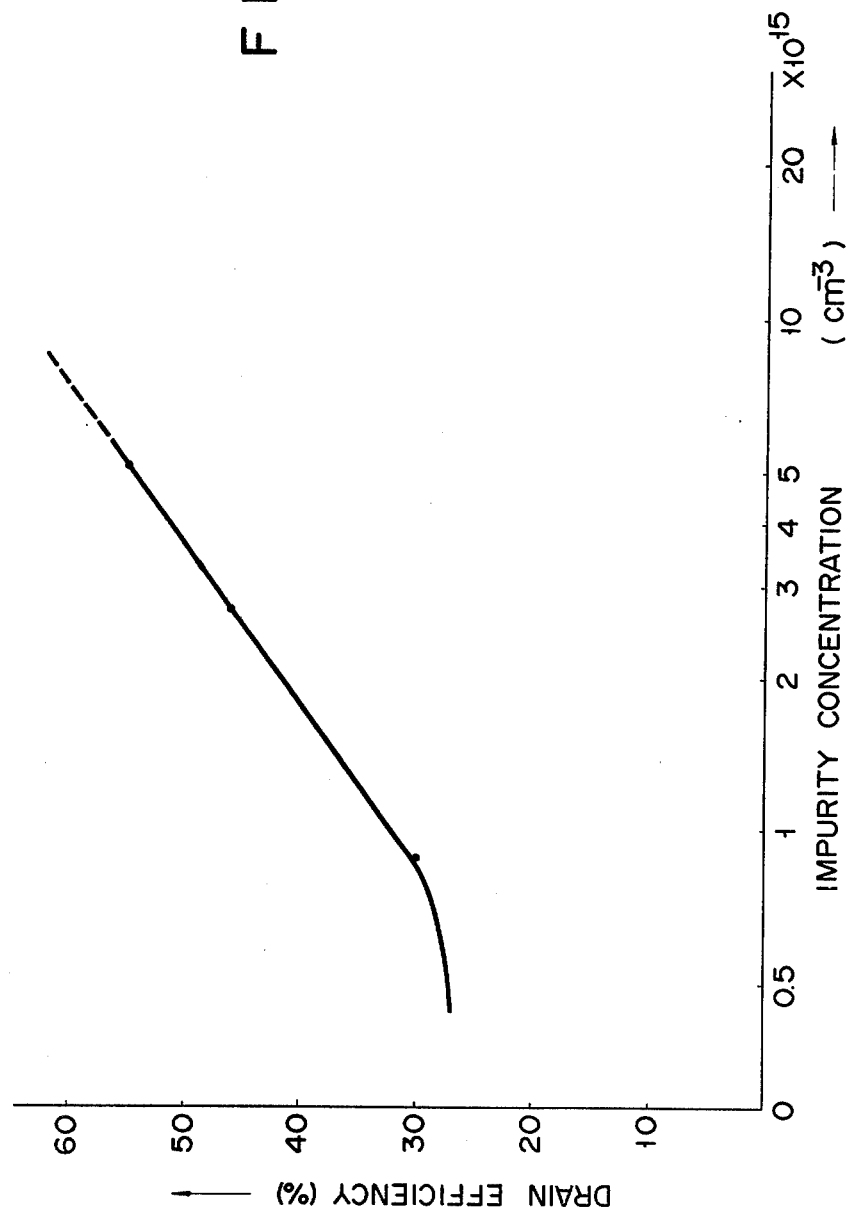
FIG. 6 is a graph illustrating the relationship between the drain efficiency and the impurity concentration of the transistor of FIG. 3.
Figure 7:
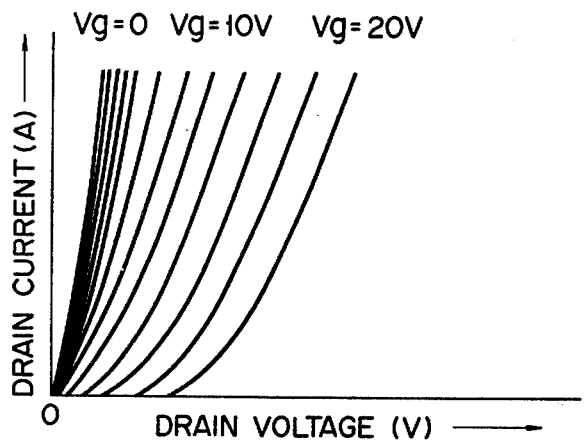
FIGS. 7 through 9 are the drain current-drain voltage characteristic curves of the FIG. 3 transistors, in which the physical dimensions of the gate regions 23 are different.
Figure 8:
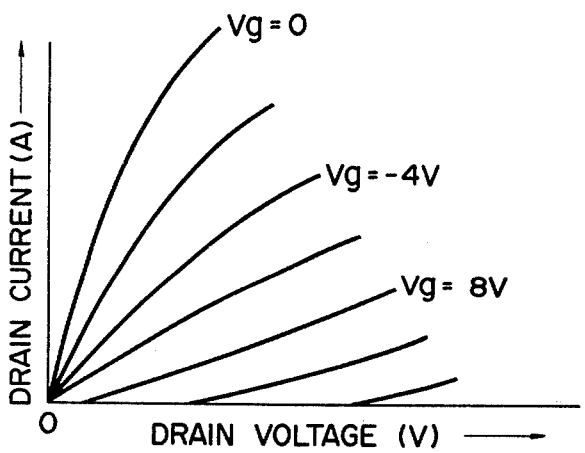
Figure 9:
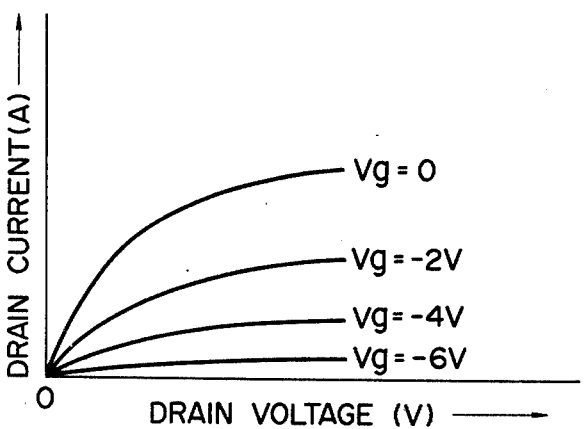

The inventors of the present application examined an effect of the impurity concentration of the N⁻ type layer 22 on the drain efficiency. In the examination, a number of the field effect transistors with different impurity concentrations of the layers 22 were are prepared and the drain efficiencies of them were measured with an equal fixed power and fixed power gain. The relation of the drain efficiency to the impurity concentration obtained when the impurity concentration was measured with the power of 1 W and the power gain of 3 dB, is illustrated in the graph in FIG. 6. As seen from the graph, the drain efficiency increases with increase of the impurity concentration. More than 50% of the drain efficiency is not obtained until the impurity concentration reaches $4 \times 10^{15}$ cm⁻³ (less than 1.4 ohm·cm of the resistivity). Through this examination, the inventors found the fact that, when the impurity concentration is more than $4 \times 10^{15}$ cm⁻³ i.e. the resistivity is less than 1.4 cm, the drain voltage versus drain current characteristic of the FET is different from that shown in FIG. 2. Further, it was found that the characteristic depends on the physical dimension of the gate region such as the depth and the width of the gate region, even if the impurity concentration is kept constant. Another experiment was conducted to confirm such that fact. In the experiment, a number of FET's were prepared in which the physical dimensions of the gate regions 23 were different with a fixed impurity concentration of $8 \times 10^{15}$ cm⁻³ of the layer 22; the drain voltage vs. drain current characteristic of them were measured. The results of the measurement are shown in FIGS. 7 to 9. The physical dimension of the gate region of FIG. 8 is larger than that of FIG. 7 but smaller than that of FIG. 9. As seen from these graphs, the maximum current decreases inversely proportional to the physical dimension. Experience shows that the voltage amplification degree is proportional to the physical dimension.

With respect to the high frequency characteristics, the FIG. 7 case has a large output power but a small power gain. In the case of FIG. 9, the power gain is larger but the output power is small. These are unsatisfactory. The FIG. 8 case is satisfactory having large power gain and output power. It is concluded therefore, that, for high frequency power transistors, the transistors having characteristic curves of super-linear (downwardly curved) and sublinear (upwardly curved) as shown in FIG. 8 are preferable when their impurity concentrations are in the order of $8 \times 10^{15}$ cm⁻³.

Figure 1:
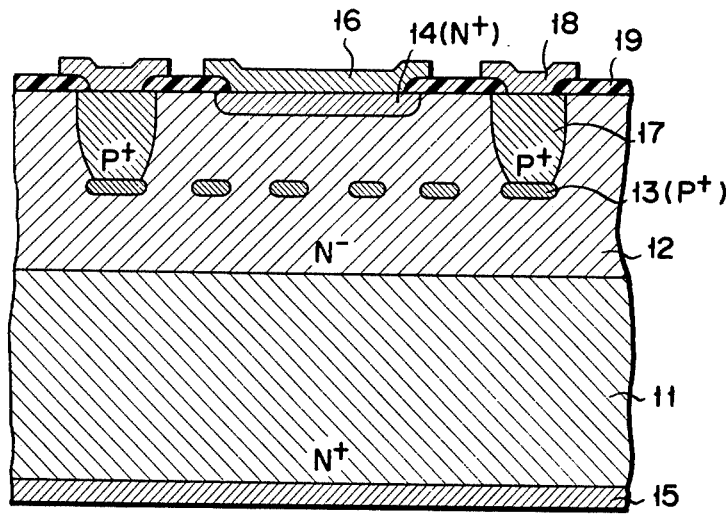
FIG. 1 is a cross sectional view of a conventional junction field effect transistor.

When the impurity concentration of the layer 22 is large, i.e. the resistivity thereof is small, another problem arises which is reduction of the percentage of qualified products. Here, the percentage of qualified products is defined as the ratio of the products which practicable withstand voltages to all the products produced. The reason for this may be explained in the following, the interval between the gate region 23 and the source region 24 in FIG. 3 is narrower than the interval between the gate region 13 and the source region 14 in FIG. 1. That is, the withstand voltage of the FIG. 3 transistor is poorer than that of the FIG. 1 transistor. Additionally, if the impurity concentration of the layer 22 is selected high, the resistivity between both regions 23 and 24 is smaller and therefore its withstand voltage also is smaller.

Figure 10:
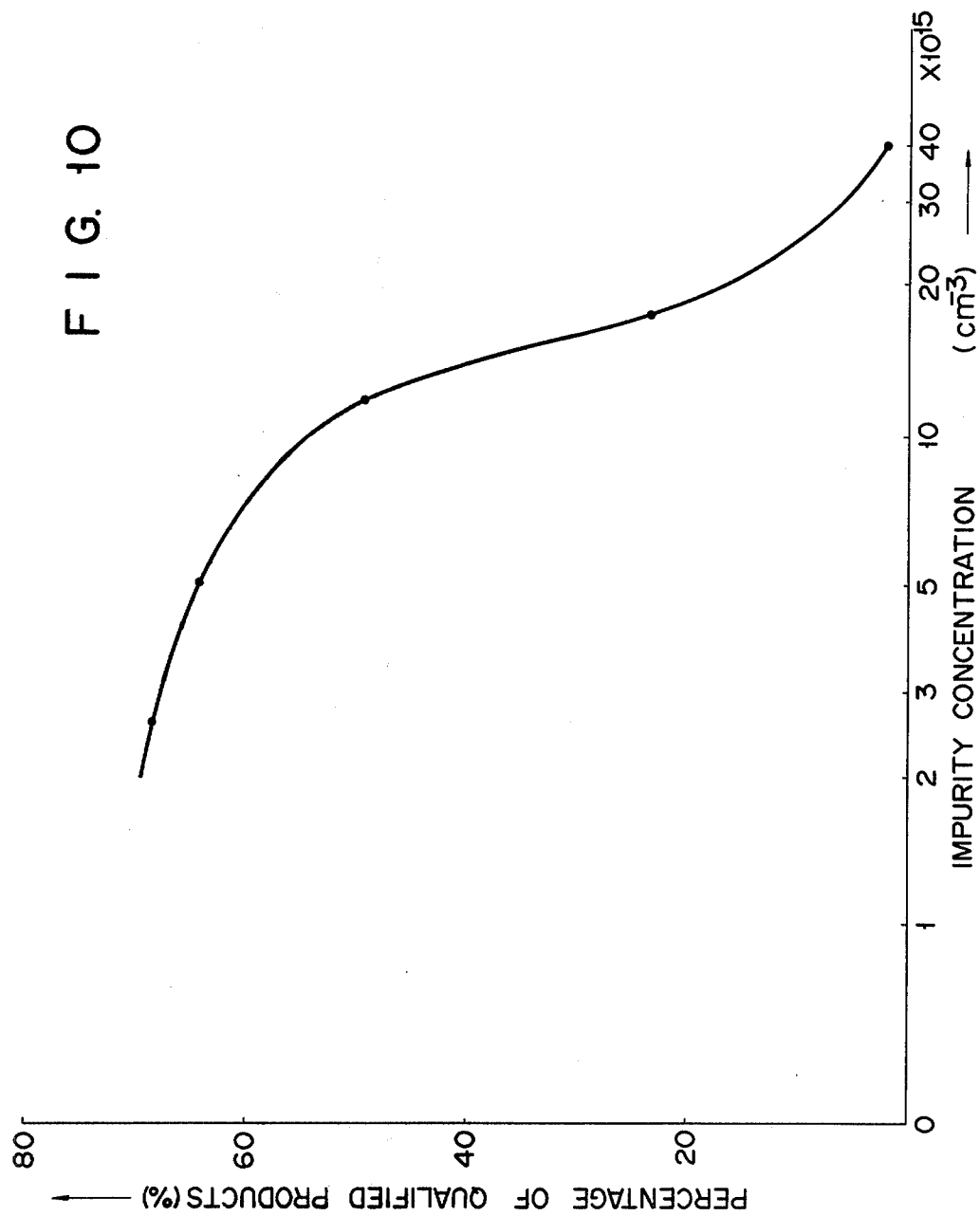
FIG. 10 shows the relationship between the impurity concentration of the layer 22 and the percentage of qualified products.

FIG. 10 shows the relation of the percentage of qualified products to the impurity concentration. The FIG. 10 curve was plotted under a condition the output power is 1 W. The graph of FIG. 10 indicates that the impurity concentration must be selected below $18 \times 10^{15}$ cm⁻³ in order to obtain a satisfactory yield of products with good high frequency characteristic.

As seen from the foregoing description, high drain efficiency and high power gain and high output power of the FET may be secured only when the impurity concentration of the layer 22 is in the range from $4 \times 10^{15}$ cm⁻³ to $18 \times 10$ cm⁻³, and the physical dimension of the gate region 23 is so selected to have the drain voltage vs. drain current characteristic as shown in FIG. 8, i.e. having the sub-linear and super-linear regions.

An additional fact was found that the high frequency characteristic of the FET depends largely on the thickness of the N⁻ type layer 22. In the experiment, 4.0 μm or less of the thickness of the layer 22 provides unsatisfactory withstand voltage between the gate and drain regions 23 and 24 and thus the output power produced is not large. 6.0 μm or more remarkably reduces the power gain. This leads to an conclusion that 4.0 to 6.0 μm thickness of the layer is preferable in order to obtain good high frequency characteristic of the transistor. It is to be noted here that the impurity concentration in the junction region between the drain and source regions with different impurities changes not stepwise but somewhat gradually. In the vicinity of the junction, impurity diffuses from the high impurity concentration layer to the low impurity concentration layer to raise the impurity concentration of the layer with low impurity concentration. For this reason, the impurity concentration at this region depicts an inclined curve of distribution. However, the region of the low impurity layer 22 distanced to some extent from the junction or interface region is little affected by the high impurity region 23. Therefore, the impurity concentration therein is kept substantially constant. From the above-mentioned reason, the "thickness" of the layer 22 means the distance from the interface between the layer 22 and the source region 24 to the position in the vicinity of the layer 21 where the impurity concentration is five times the constant impurity concentration of the layer 22.

The drain current to drain voltage characteristics of the field effect transistors were measured. In the measurement, the impurity concentration of the layer 22 and the physical dimension of the gate region 23 were treated as parameters and the thickness of the layer 22 was also changed within the range from 4.0 to 6.0 $\mu$m. From this measurement, it was seen that, in order to give the drain current-drain voltage characteristic as shown in FIG. 8 to the transistors with 4.0 to 6.0 $\mu$m thickness, the physical dimension of the layer 23 must be large as the impurity concentration of the layer 22 increases. In other words, for such a purpose, the channel minimum width L must be made narrow. Further, when the transistors with the impurity concentrations from $4 \times 10^{15}$ to $18 \times 10^{15}$ cm$^{-3}$ exhibit the characteristic as shown in FIG. 8, the channel minimum width L must fall within the box shown in FIG. 11. As previously stated, the Y-distance of the rectangular coordinates in FIG. 11 represents the minimum width L of channel and the X-distance represents the impurity concentration of the layer 22 in the logarithmic scale. The respective corners A, B, C and D of the box are the following coordinates: A is ($\log_{10} 4 \times 10^{15}$, 2.0), B ($\log_{10} 18 \times 10^{15}$, 1.2), C ($\log_{10} 18 \times 10^{15}$, 0.5) and D ($\log_{10} 4 \times 10^{15}$, 1.1).

A number of transistors were prepared with the thickness 22 ranging from 4.0 to 6.0 $\mu$m and with the box characteristic FIG. 11. These transistors were operated in high frequency range. The result is that, up to about 1 W of the output power, the common source operational mode provides high power gain and when the output power is more than 3 W, the common gate operational mode is desirable for providing high power gain. Therefore, when these transistors are used in high frequencies, the common gate operational mode is desirable for such the transistors operation.

In the above description, the source region 24 and the drain region 21 are of N conductivity type and the gate region 23 is of P conductivity type. However, these conductivity types for these regions may be reversed; the N type is reversed to P type and vice versa. Further, the substrate may be made of germanium instead of silicon. The source region 24 and the gate region 23 may be formed by using diffusion or ion implantation method. The layer 22 may be formed by the epitaxial growth method.

Figure 12:
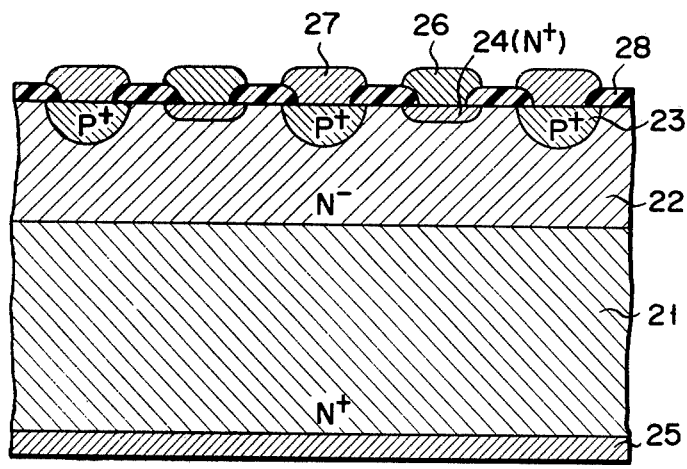
FIGS. 12 and 13 show other embodiments of the field effect transistor according to the invention.
Figure 13:
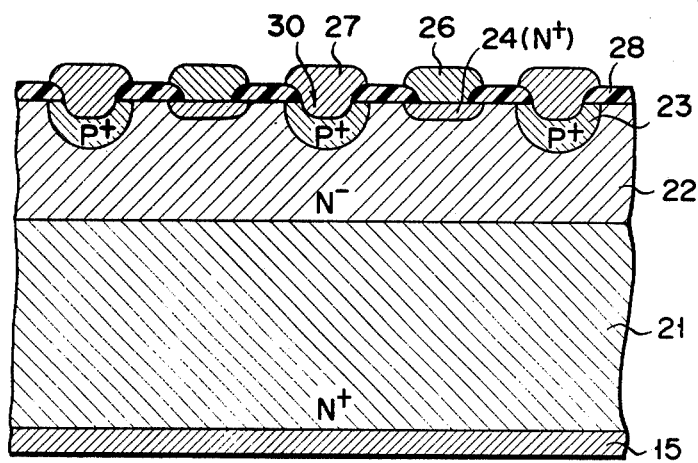

Turning now to FIG. 3, the field effect transistor to which the present invention is applied has shallow grooves 29 between the source region 24 and the gate region 23. The invention also is applicable for transistors as shown in FIGS. 12 and 13. The transistor of FIG. 12 has no groove and the FIG. 13 transistor has grooves 30 of the gate regions 23. Like reference numerals in FIG. 3 are applied to designation of like portions in FIGS. 12 and 13.

While the above-description relates to specific principles of this invention, it is to be understood that this description is made only by way of example and not as a limitation thereon, for one skilled in the art may make modification thereto, but still be within the true spirit and scope of this invention as set forth in the appended claims.

What we claim is:

1. A junction field effect transistor comprising:
   a first conductivity type substrate with high impurity concentration;
   a first conductivity type layer with a low impurity concentration of $4 \times 10^{15}$ to $18 \times 10^{15}$ cm$^{-3}$ which is layered on said substrate;
   a first region of first conductivity type and of high impurity concentration which is formed in the surface region of said layer;
   a second region of second conductivity type and of high impurity concentration which is formed in the surface region of said layer adjacent side walls of said first region in a manner not in contact with said first region; and
   wherein the thickness of said layer is 4.0 to 6.0 $\mu$m and the minimum channel width of that portion of said layer in contact with said second region and the impurity conentration of said layer fall within the area with four corners A, B, C and D where these corners correspond to the four points ($\log_{10} 4 \times 10^{15}$, 2.0), ($\log_{10} 18 \times 10^{15}$, 1.2), ($\log_{10} 18 \times 10^{15}$, 0.5) and ($\log_{10} 4 \times 10^{15}$, 1.1) of a rectangular coordinate system having X and Y axes of which the Y-distance is said minimum channel width in microns and the X-distance is the impurity concentration in atoms per cubic centimeter of said layer in the logarithmic scale.

2. A junction field effect transistor comprising:
   a first conductivity type substrate with high impurity concentration;
   a first conductivity type layer with a low impurity concentration of $4 \times 10^{15}$ to $18 \times 10^{15}$ cm$^{-3}$ which is layered on said substrate;
   a first region of first conductivity type and of high impurity concentration which is formed in the surface region of said layer;
   a second region of second conductivity type and of high impurity concentration which is formed in the surface region of said layer adjacent side walls of said first region in a manner not in contact with said first region; and
   wherein the minimum channel width of that portion of said layer in contact with said second region and the impurity concentration of said layer fall within the area with four corners A, B, C and D where these corners correspond to the four points ($\log_{10} 4 \times 10^{15}$, 2.0), ($\log_{10} 18 \times 10^{15}$, 1.2), ($\log_{10} 18 \times 10^{15}$, 0.5) and ($\log_{10} 4 \times 10^{15}$, 1.1) of a rectangular coordinate system having X and Y axes of which the Y-distance is said minimum channel width in microns and the X-distance is the impurity concentration in atoms per cubic centimeter of said layer in the logarithmic scale.

* * * * *